(12) United States Patent  (10) Patent No.: US 7,315,445 B2
Kirby et al.  (45) Date of Patent: Jan. 1, 2008

(54) ELECTRICAL APPARATUS

(75) Inventors: Keith Kirby, Shipley (GB); Mark Newton, Shipley (GB)

(73) Assignee: Pace Micro Technology Plc., Saltaire, Shipley (GB)

(*) Notice: Subject to any disclaimer, the term of this patent is extended or adjusted under 35 U.S.C. 154(b) by 78 days.

(21) Appl. No.: 11/147,974

(22) Filed: Jun. 8, 2005

(65) Prior Publication Data

US 2005/0277308 A1  Dec. 15, 2005

(30) Foreign Application Priority Data

Jun. 15, 2004  (GB) ................................. 0413340.1

(51) Int. Cl.
*G06F 1/16* (2006.01)

(52) U.S. Cl. ...................... 361/685; 439/500; 174/562; 710/302

(58) Field of Classification Search .................. 429/96; 439/500; 710/302; 361/679–687, 724–727; 174/16.1, 555, 562
See application file for complete search history.

(56) References Cited

U.S. PATENT DOCUMENTS

| 6,262,883 | B1 * | 7/2001 | Kim ............................ 361/680 |
| 6,704,196 | B1 * | 3/2004 | Rodriguez et al. .......... 361/687 |
| 6,768,638 | B2 * | 7/2004 | Shih ............................ 361/685 |
| 6,822,858 | B2 * | 11/2004 | Allgeyer et al. ............ 361/685 |
| 6,999,319 | B2 * | 2/2006 | Wu et al. .................... 361/724 |

* cited by examiner

*Primary Examiner*—Hung Van Duong
(74) *Attorney, Agent, or Firm*—Head, Johnson & Kachigian

(57) ABSTRACT

Electrical apparatus in the form of a broadcast data receiver or set top box is provided including a housing for the location of one or more electrical components therein. The electrical components include a hard disk drive (HDD). The HDD is separated from one or more further electrical components by partition means provided in the housing.

17 Claims, 5 Drawing Sheets

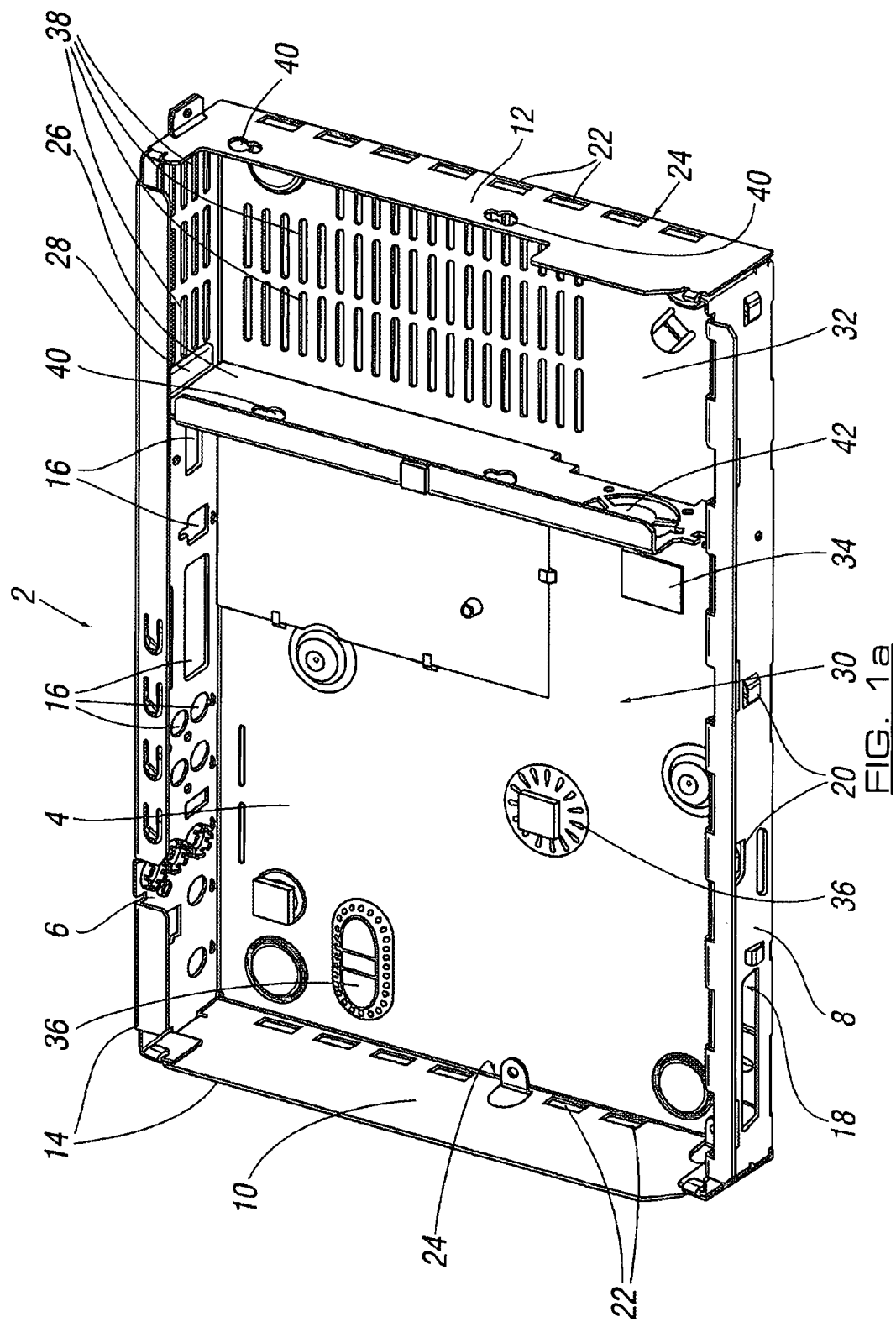

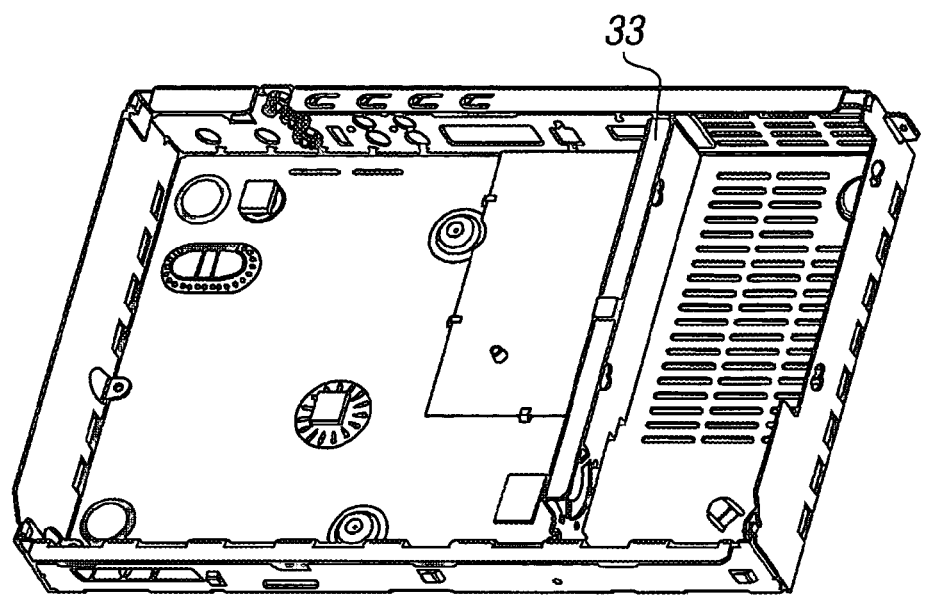
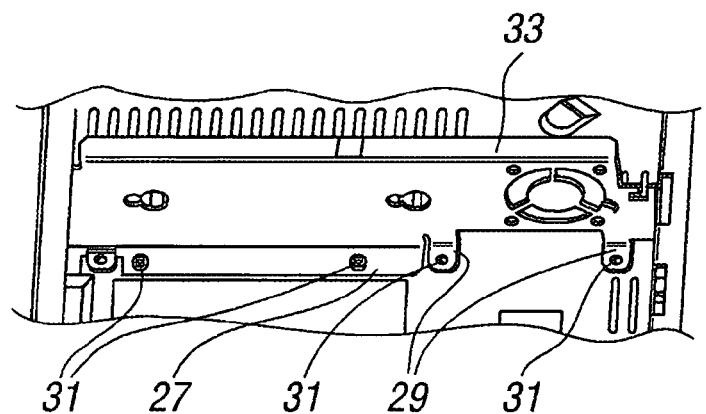
FIG. 1b
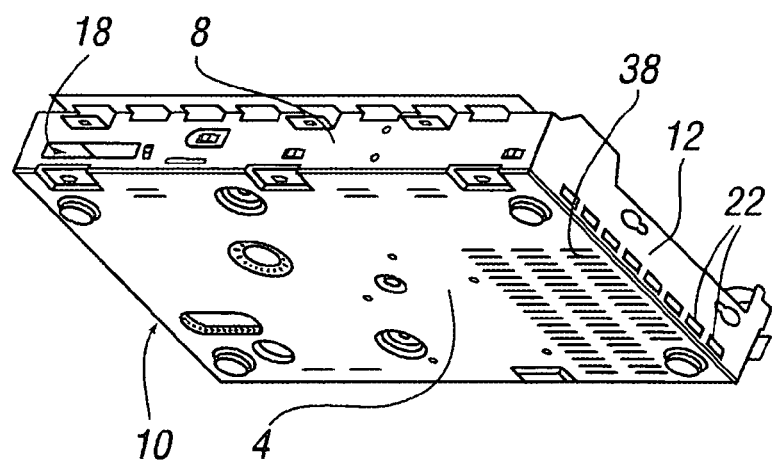
FIG. 1c

ELECTRICAL APPARATUS

CROSS-REFERENCE TO RELATED APPLICATION

This United States patent application entitled "Improvements To Electrical Apparatus" claims priority to British Application No. 0413340.1 filed 15 Jun. 2004.

STATEMENT REGARDING FEDERALLY SPONSORED RESEARCH DEVELOPMENT (N/A)

INCORPORATED BY-REFERENCE OF MATERIAL SUBMITTED ON A COMPACT DISC (N/A)

BACKGROUND OF THE INVENTION (1) Field of the Invention

This invention relates to improvements to electrical apparatus.

Although the following description refers almost exclusively to electrical apparatus in the form of a broadcast data receiver (BDR) of a type which receives data from a remote broadcast provider and processes and decodes said data to provide video, audio and/or auxiliary data for display on a display screen or listening to via speakers, it will be appreciated by persons skilled in the art that the present invention can relate to any type of electrical apparatus, such as a personal computer, video, DVD player and/or the like.

(2) Background Art

Conventionally, BDRs include a housing in which a plurality of electrical components are provided to allow the processing and decoding of data received by and/or to be transmitted by said apparatus, such as for example one or more micro-processing chips, capacitors, resistors and/or similar. A hard disk drive (HDD) is provided to allow data to be read, written and stored in the apparatus. In addition, the BDR typically has one or more electrical connections to any or any combination of a television set, mains power supply, speakers, video, DVD player, headphones, keyboard and/or the like. All these electrical components and generate heat which can damage the electrical components and/or reduce the efficiency of the same. The HDD is particularly sensitive to heat and the efficiency of the same can be significantly influenced by temperature rises in the apparatus as a result of power dissipation from other electrical components in the locality. In hot countries, such as parts of Australia, where the ambient air temperature is relatively high, there is a smaller margin for increase in the temperature surrounding the HDD in use of the apparatus.

In order to prevent, or at least reduce damage caused to electrical components within the BDR as a result of excessive temperatures, it is known to provide a number of ventilation mechanisms, such as one or more air circulation vents or air cooling channels to allow cooling by convection, fans to allow cooling using forced air circulation and/or the like. However, it has been found difficult to position these ventilation mechanisms within the housing in such locations to allow both efficient convection and forced ventilation cooling. For example, if the fan is fitted on one wall of the housing, the circulation of air generated by the fan is often insufficient to reach electrical components adjacent the opposing wall. In addition, provision of a fan on an interior surface of an exterior wall of the housing increases the noise and vibration associated with the housing when in an "on" condition and is undesirable.

BRIEF SUMMARY OF THE INVENTION

It is therefore an object of the present invention to provide improved electrical apparatus which increases the ventilation and convection flow to at least part of the apparatus.

It is a further object of the present invention to provide improved electrical apparatus which reduces or at least maintains the temperature surrounding at least the hard disk drive in the apparatus.

According to a first aspect of the present invention there is provided electrical apparatus, said apparatus including a housing for the location of one or more electrical components therein, said electrical components including at least one hard disk drive (HDD), and wherein said at least one HDD is separated from one or more further electrical components by partition means.

Thus, by decoupling, isolating or separating the HDD in the housing from the other heat generating electrical components in the apparatus, the temperature in the locality of the HDD can be more easily controlled without the requirement of additional air circulation means or heat sink means.

In one embodiment the HDD is typically substantially wholly surrounded by said partition means and/or one or more walls of said housing.

Preferably the partition means divides the housing interior into at least a first compartment for the location of said one or more further electrical components and at least a second compartment for the location of said HDD.

Preferably air circulation means are provided on or associated with said partition means and/or suspension means via which the HDD is suspended in the housing. The air circulation means can be in the form of one or more fans and/or similar. The partition means can be shaped and/or formed in any suitable manner so as to receive suitable air circulation means. The fans are typically powered fans but can be non-powered.

By providing air circulation means on or with the partition means, the air circulation means are removed from an exterior wall of the housing, thereby reducing the noise associated therewith, typically as a result of the finger guard over the fan no longer being required. In addition, in having the air circulation means located a distance from the peripheral edges, air circulation within the entirety of the housing can be improved. Furthermore, more ventilation slots can be provided on the walls of the outer housing than is possible with prior art designs, thereby improving the effectiveness of convection cooling whilst maintaining means for providing efficient forced air cooling.

In one embodiment the HDD is attached to the partition means in use, thereby maintaining the position of the HDD within the housing. The HDD can also or alternatively be attached to one or more walls of the housing, such as the base, top, side walls and/or end walls.

Thus, by providing the partition means, the requirement for specialist HDD fixing brackets (i.e. in the form of a die cast HDD mounting cradle) is removed, thereby reducing the cost associated with manufacturing the apparatus.

In one embodiment the HDD is suspended within the housing or compartment of the housing via suspension means. The suspension means can include one or more mounting brackets for attachment to the partition means and/or one or more walls of the housing.

In one embodiment partition means and/or suspension means includes one or more air vents thereon.

In an alternative embodiment the partition means is substantially continuous along its length.

Preferably the partition means is provided with attachment means thereon for allowing attachment of the partition means to one or more walls of the housing. The partition means can be provided at any required orientation in the housing.

The attachment means can include any or any combination of one or more screws, bolts, welding, adhesive, clips, inter-engaging means, engagement means for engaging with complementary engaging means on the housing and/or the like.

Preferably the partition means includes one or more panels, such as for example sheet material, which are located between one or more walls of the housing to define at least two compartments therein.

Preferably the electrical apparatus is in the form of a broadcast data receiver (BDR).

The HDD suspension means can suspend the HDD above or below one or more further components located in the compartment with the HDD (i.e. low or non heat generating components) or external to the HDD compartment.

The partition means and/or walls of the housing can surround the HDD in the suspended position and/or the suspension means can provide one or more portioning surfaces.

Suspension of the HDD allows air to circulate around the HDD more easily and also increase the available space on the rear wall panel or other panels for connection means to be located.

In one embodiment the suspension means is attached to the front and rear walls of the housing.

One or more rib members can be provided on the partition means and/or suspension means to increase the strength and/or rigidity of the same.

One or more ventilation holes can be provided in one or more PCBs provided within the HDD compartment to further enhance cooling.

According to a second aspect of the present invention there is provided a housing for electrical apparatus for the location of one or more electrical components therein. The housing can include at least a top wall, side walls and end walls, and partition means can be provided in said housing between one or more walls thereof to define at least a first compartment and a second compartment, one of said first and/or second compartments being used to contain a HDD is use.

According to a further aspect of the present invention there is provided electrical apparatus, said apparatus including a housing for the location of one or more electrical components, said electrical components including at least one hard disk drive (HDD), said HDD separated from said one or more electrical components by partition means and wherein air circulation means are provided on or associated with said partition means.

DESCRIPTION OF THE DRAWINGS

Embodiments of the present invention will now be described with reference to the accompanying figures, wherein:

FIG. 1a is a perspective view of the housing of electrical apparatus according to one embodiment of the present invention;

FIG. 1b is a detailed view of the partition plate used in FIG. 1a;

FIG. 1c is a perspective view of the housing of electrical apparatus from the base shown in FIG. 1a;

DESCRIPTION OF THE PREFERRED EMBODIMENTS

Figure 2:
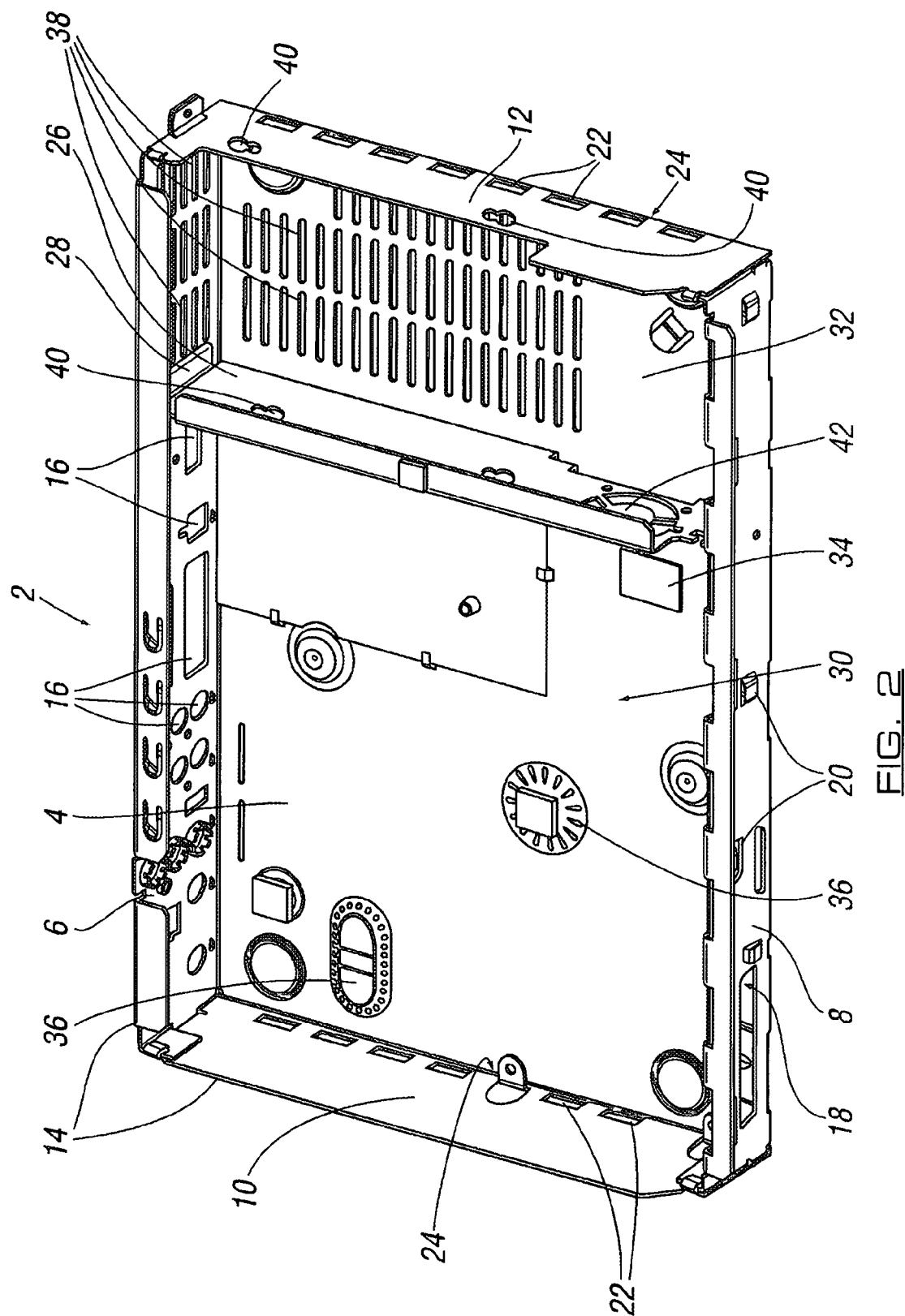
FIG. 2 is an alternative embodiment of a housing for electrical apparatus.

Referring to the FIGS. 1a-1c, there is illustrated a housing 2 for electrical apparatus in the form of a broadcast data receiver (BDR). The housing includes a base 4, side walls 6, 8 and end walls 10, 12. A top (not shown) will also form part of the housing in use and will typically be fitted along upper edge 14 of side walls 6, 8 and end walls 10, 12.

Side wall 6 typically forms a rear panel of the apparatus in use and includes a plurality of different shaped apertures 16 to allow different connection means, such as plug sockets, adaptor sockets, SCART connections and/or the like to be located therethrough in use.

Side wall 8 typically forms a front panel of the apparatus in use and includes a slot 18 therein for the location of a smart card receiving device and connection means 20 for allowing the connection of a front panel display unit (not shown) thereto in use.

End walls 10, 12 are provided with a plurality of apertures or ventilation slots 22 along a lower edge 24 thereof to allow air to circulate through the housing 2 in use.

In accordance with the present invention, partition means are provided in the housing 2 in the form of a partition panel 26 to form a first compartment 30 and a second compartment 32. Partition panel 26 is provided substantially parallel with end walls 10, 12 and ends 28 of panel 26 abut with side walls 6, 8. Flanges 27, 29 are provided along a lower edge of panel 26 to allow attachment of the panel to base 4 via screw apertures 31. Flange 33 is provided along an upper edge of panel 26 to allow attachment of the panel to a lid or top of the housing.

First compartment 30 is defined between side walls 6, 8, end wall 10 and partition panel 26. Second compartment 32 is defined between side walls 6, 8, end wall 12 and partition panel 26.

First compartment 30 is used to contain one or more printed circuit boards (PCBs) in use, said PCBs including a plurality of electrical components thereon. Various foam pads 34 and heat sink devices 36 can be provided to protect components from damage and to reduce temperatures associated therewith.

Second compartment 32 is used to house a hard disk drive (HDD) of the BDR. Since the efficiency of the HDD is dependent of the surrounding temperature, it is necessary to maintain the HDD at a constant temperature. A plurality of air vents 38 are provided on base 4 and side wall 6 to allow cooling by convection flow.

Connection apertures 40 are provided on end wall 12 and partition panel 26 to allow connection means, such as screws, to be located therethrough to secure the HDD in a required position in use.

Partition panel 26 is also provided with an aperture 42 for the location of a fan therewith. By providing the fan on an inner dividing wall rather than an exterior side or end wall of the housing, the noise generated by the fan is significantly reduced and the requirement for providing a finger guard on the exterior surface of the housing is removed. In addition, the vibration of the exterior housing as a result of the fan is also removed.

In an alternative embodiment, the partition panel could be provided in a substantially continuous form, as shown in FIG. 2, wherein the aperture for air circulation means, such as a fan, are not provided. The compartment defined between the partition panel and the walls of the housing is typically of only slightly larger dimensions than the HDD to be contained therein.

The fan in one example is typically only moved to an "on" condition when the temperature in the housing rises to a pre-determined level.

The partition means can be made from the same material from which the housing is formed or can be made from any material having thermal insulating properties.

Figure 3:
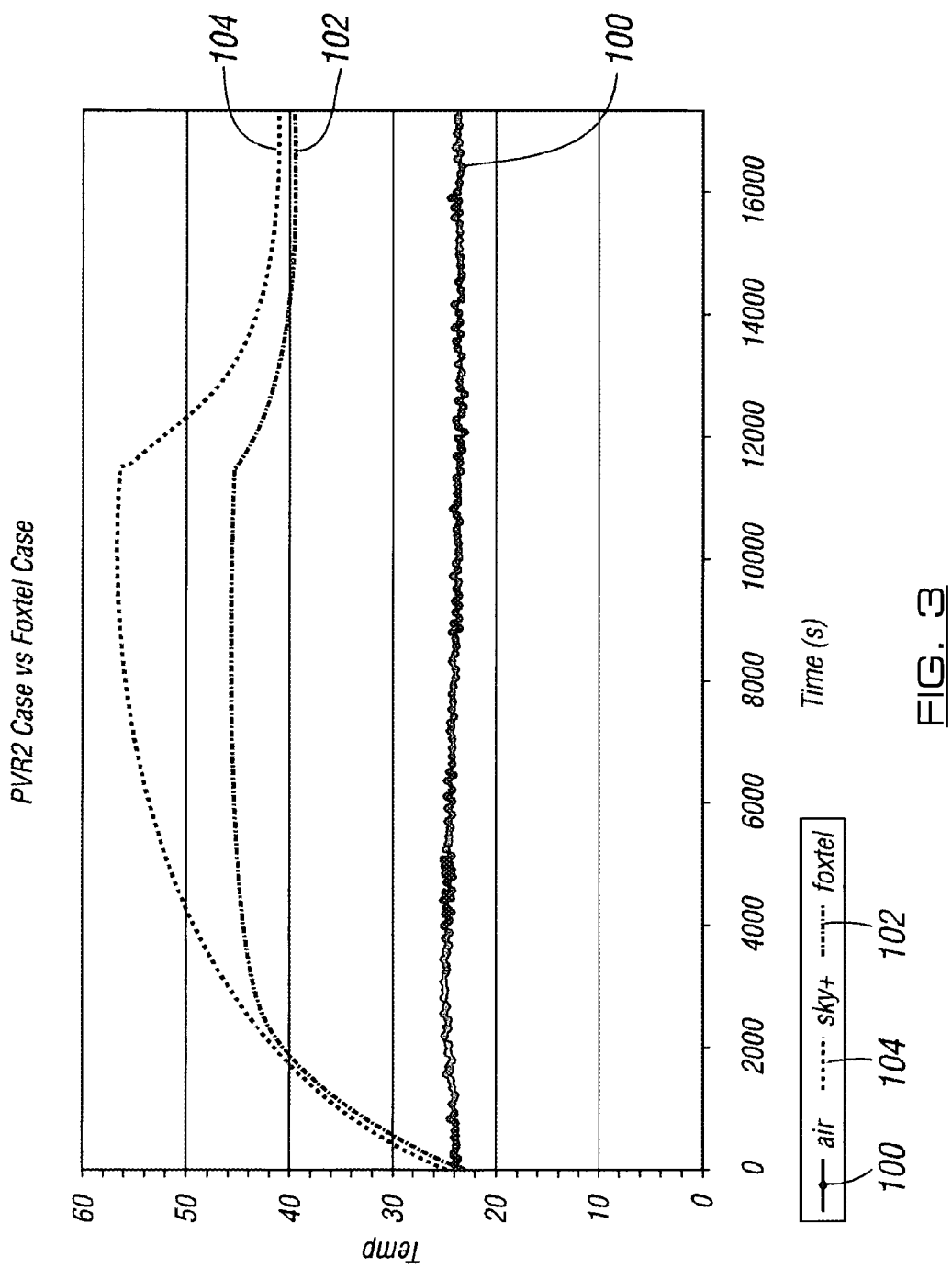
FIG. 3 is a graph illustrating the temperature change in time compared to the ambient temperature, conventional apparatus and apparatus according to the present invention.

Referring to FIG. 3, there is shown a graph illustrating the temperature change on the Y axis against time on the X axis. Plot 100 represents the change in ambient temperature with time, plot 102 represents the change in temperature of the apparatus in use over time according to the present invention incorporating the partition means, and plot 104 represents the change in temperature of the apparatus in use over time when no partition means are provided. It can be seen that the present invention significantly reduces the temperature rise during operation of the apparatus.

Figure 4:
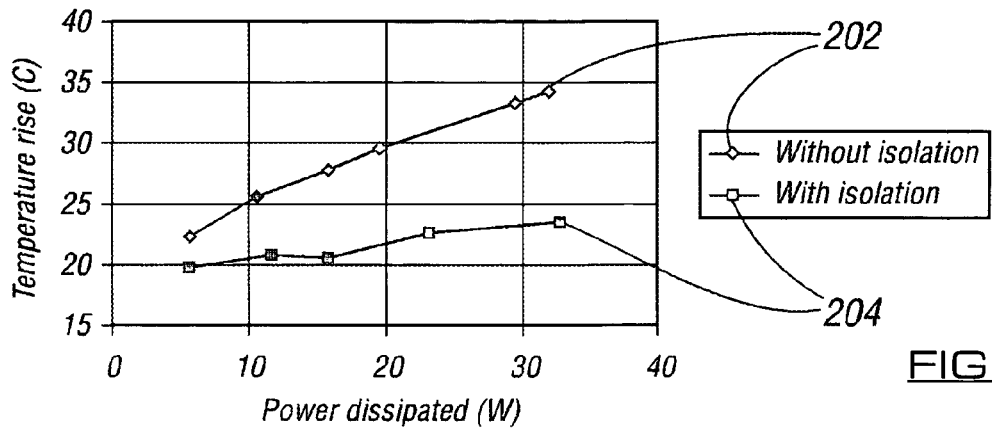
FIG. 4 is a graph illustrating the temperature rise of a HDD motor versus power dissipated.

FIG. 4 is a graph showing the temperature rise of a HDD motor in apparatus versus power dissipated in electrical components of an adjacent compartment. Temperature is shown on the X axis and power dissipated is shown on the Y axis. Plot 202 illustrates that a significantly larger temperature rise is experienced in HDD motors for which the HDD is not isolated from the remaining components of the electrical apparatus compared to plot 204 for HDD motors when the HDD is isolated from the remaining components of the electrical apparatus via partition means.

Figure 5A:
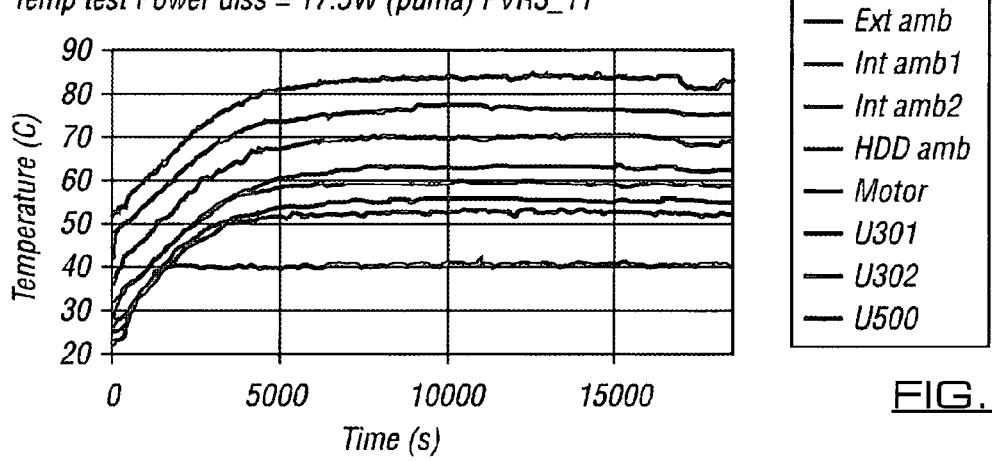
FIG. 5a is a graph illustrating the rise in temperature of different apparatus incorporating the invention in time.
Figure 5B:
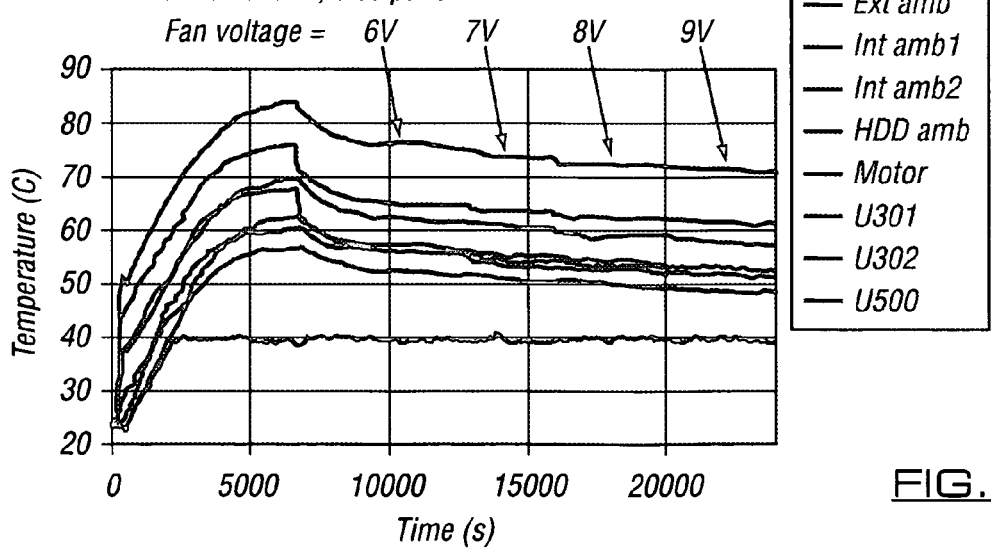
FIG. 5b is a graph illustrating the rise in temperature of apparatus in FIG. 5a in time.

FIG. 5a is a graph illustrating the change in temperature shown on the X axis against time shown on the Y axis for a plurality of different apparatus incorporating the present invention. FIG. 5b is a similar graph to FIG. 5a but shows the effect of a fan being used on the partition panel. The voltage applied to the fan was moved in increments of 1V from 6V to 9V. It can clearly be seen from the graph the reduction in temperature achieved by using the fan on the partition panel.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

The invention claimed is:

1. Electrical apparatus, said apparatus comprising:
   a housing for the location of one or more electrical components therein, said electrical components having at least one hard disk drive being separated from one or more further electrical components by a partition means;
   said at least one hard disk drive being substantially wholly surrounded by said partition means and/or one or more walls of said housing;
   an interior of said housing being divided into at least a first compartment for location of said one or more further electrical components and at least a second compartment for location of said hard disk drive; and
   air circulation means located in the interior of the housing and in the form of one or more fans are provided on or associated with said partition means between said at least one hard disk drive and said one or more further electrical components.

2. Apparatus according to claim 1 wherein said hard disk drive is attached to said partition means in use.

3. Apparatus according to claim 1 wherein said hard disk drive is attached to said one or more walls of said housing.

4. Apparatus according to claim 1 wherein said hard disk drive is suspended in said housing via suspension means.

5. Apparatus according to claim 4 wherein said suspension means includes one or more mounting brackets for mounting to said partition means and/or to said one or more walls of said housing.

6. Apparatus according to claim 4 wherein said suspension means forms part of said partition means.

7. Apparatus according to claim 4 wherein one or more rib members are provided on said suspension means.

8. Apparatus according to claim 4 wherein said suspension means includes one or more air vents thereon.

9. Apparatus according to claim 1 wherein said partition means is substantially continuous along its length.

10. Apparatus according to claim 1 wherein said partition means include attachment means for attachment of the same to said one or more walls of said housing.

11. Apparatus according to claim 10 wherein said attachment means includes any or any combination of one or more screws, bolts, welding clips, adhesive or inter-engaging members.

12. Apparatus according to claim 1 wherein said partition means includes one or more panel members for location between said one or more walls of said housing.

13. Apparatus according to claim 1 wherein the apparatus is in the form of a broadcast data receiver.

14. Apparatus according to claim 1 wherein one or more flanges are provided on or are associated with said partition means to allow connection of said partition means to said one or more walls of said housing.

15. A housing for use with electrical apparatus according to claim 1.

16. Apparatus according to claim 1 wherein said partition means includes one or more air vents thereon.

17. Apparatus according to claim 1 wherein said one or more fans is moved to an on condition when temperature in said housing rises to a pre-determined level.

* * * * *